(12) United States Patent
Quach

(10) Patent No.: US 8,104,895 B2
(45) Date of Patent: Jan. 31, 2012

(54) ONE-WAY TRANSPARENT DISPLAY SYSTEMS

(76) Inventor: Cang V. Quach, Milpitas, CA (US)

( * ) Notice: Subject to any disclaimer, the term of this patent is extended or adjusted under 35 U.S.C. 154(b) by 0 days.

(21) Appl. No.: 12/945,080

(22) Filed: Nov. 12, 2010

(65) Prior Publication Data

US 2011/0057212 A1    Mar. 10, 2011

Related U.S. Application Data

(62) Division of application No. 11/367,687, filed on Mar. 3, 2006, now Pat. No. 7,854,513.

(51) Int. Cl.
*G03B 21/14* (2006.01)
*G03B 21/60* (2006.01)
*G03B 21/56* (2006.01)
*G02F 1/1335* (2006.01)
*H01L 35/24* (2006.01)

(52) U.S. Cl. ............ 353/20; 353/84; 359/453; 359/459; 359/460; 349/96; 349/194; 257/40

(58) Field of Classification Search .................. 353/20, 353/84; 359/453, 485, 459, 489, 460; 349/96, 349/194; 257/40
See application file for complete search history.

(56) References Cited

U.S. PATENT DOCUMENTS

| | | | |
|---|---|---|---|
| 3,248,165 A | 4/1966 | Marks et al. |
| 5,469,295 A | 11/1995 | Burke |
| 5,703,436 A | 12/1997 | Forrest et al. |
| 5,708,522 A | 1/1998 | Levy |
| 5,986,401 A | 11/1999 | Thompson et al. |
| 6,064,521 A | 5/2000 | Burke |
| 6,262,441 B1 | 7/2001 | Bohler et al. |
| 6,395,863 B2 | 5/2002 | Geaghan |
| 6,420,031 B1 | 7/2002 | Parthasarathy et al. |
| 6,522,311 B1 | 2/2003 | Kadowaki et al. |
| 6,548,956 B2 | 4/2003 | Forrest et al. |
| 6,555,968 B2 | 4/2003 | Yamazaki et al. |
| 6,639,357 B1 | 10/2003 | Parthasarathy et al. |
| 6,811,815 B2 | 11/2004 | He et al. |
| 6,822,772 B2 | 11/2004 | Ebert et al. |
| 6,870,670 B2 | 3/2005 | Gehring et al. |

(Continued)

FOREIGN PATENT DOCUMENTS

EP    0434065 A2    6/1991

(Continued)

OTHER PUBLICATIONS

"TOLED® Transparent and Top-emitting OLEDs," Universal Display: TOLED Technology, downloaded on Feb. 21, 2006 from http://www.universaldisplay.com/toled.htm, 2 pages.

(Continued)

*Primary Examiner* — Georgia Y Epps
*Assistant Examiner* — Magda Cruz
(74) *Attorney, Agent, or Firm* — Patent Law Group LLP; David C. Hsia

(57) ABSTRACT

A display system includes a projection screen and a projector. The projection screen includes a retarder plate between a polarizer and a transparent screen. The projector projects an image through the polarizer and the retarder plate onto the transparent screen. The image is visible from a first side of the transparent screen but invisible from a second side of the transparent screen because any light passing twice through the retarder plate is blocked by the polarizer.

8 Claims, 3 Drawing Sheets

U.S. PATENT DOCUMENTS

| | | | |
|---|---|---|---|
| 6,873,093 B2 | 3/2005 | Yu et al. | |
| 6,885,149 B2 | 4/2005 | Parthasarathy et al. | |
| 6,894,750 B2 | 5/2005 | Zhuang et al. | |
| 6,900,458 B2 | 5/2005 | Tung et al. | |
| 6,933,532 B2 | 8/2005 | Arnold et al. | |
| 6,936,960 B2 | 8/2005 | Cok | |
| 6,940,643 B2 | 9/2005 | Ma et al. | |
| 6,955,578 B2 | 10/2005 | Park et al. | |
| 6,961,105 B2 | 11/2005 | Chang et al. | |
| 6,987,547 B2 | 1/2006 | Yang et al. | |
| 6,992,822 B2 | 1/2006 | Ma et al. | |
| 2003/0095135 A1* | 5/2003 | Kaasila et al. | 345/613 |
| 2003/0214632 A1 | 11/2003 | Ma et al. | |
| 2006/0181769 A1 | 8/2006 | Kumasawa et al. | |

FOREIGN PATENT DOCUMENTS

| | | |
|---|---|---|
| EP | 0639788 A1 | 2/1995 |
| JP | 2000147428 | 5/2000 |

OTHER PUBLICATIONS

M.W. Lauhof et al., "Polarized Emission of PPV Oligomers," paper No. 31, German Liquid Crystal Society (GLCS), downloaded on Feb. 25, 2006 from http://frs106.physik.uni-freiburg.de/DFKG/conferences_en_html, 15 pages.

Heiko Thiem, "New Flourene Based Materials for Organic Electronics," Dissertation, University of Bayreuth, 2005, pp. 1-16.

PCT/US2006/010517, Annex to Form PCT/ISA/206, Communication Relating to the Result of the Partial International Search, 5 pages, Mar. 21, 2006.

PCT/US2007/005360, PCT International Search Report and Written Opinion of the International Searching Authority, 15 pages, Feb. 27, 2007.

PCT/US2006/010517, PCT International Search Report, 6 pages, Mar. 21, 2006.

PCT/US2006/010517, PCT Written Opinion of the International Searching Authority, 10 pages, Mar. 21, 2006.

* cited by examiner

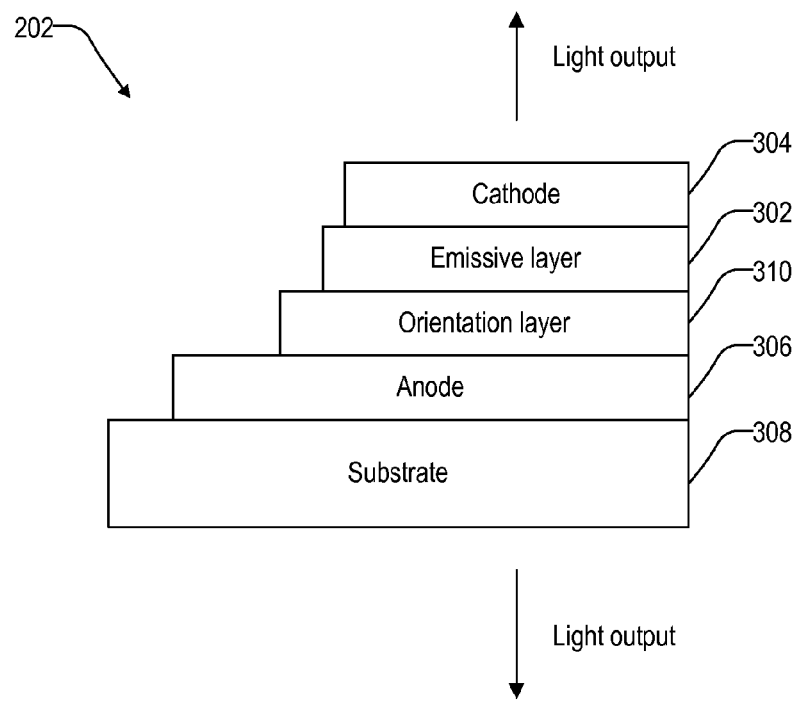
Fig. 3
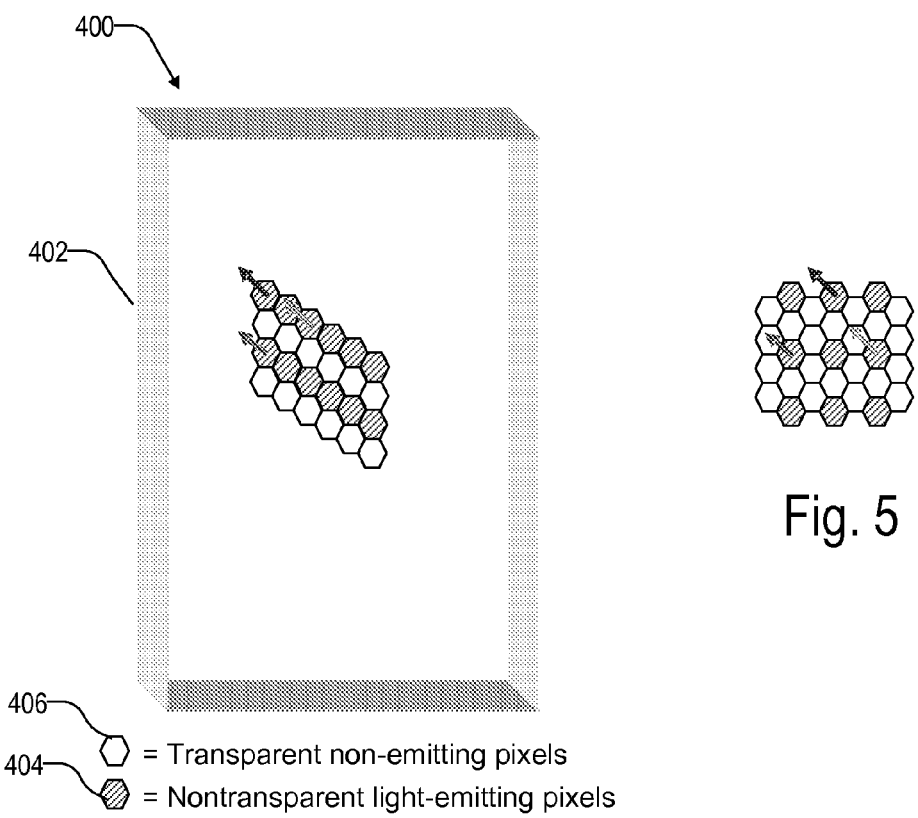
Fig. 4
Fig. 5

ONE-WAY TRANSPARENT DISPLAY SYSTEMS

CROSS REFERENCE TO RELATED APPLICATION

This application is a divisional of application Ser. No. 11/367,687, filed Mar. 3, 2006, which is incorporated herein by reference, which application is related to U.S. patent application Ser. No. 11/109,543, entitled "Polarized Projection Display," filed on Apr. 18, 2005, which is incorporated herein by reference.

FIELD OF INVENTION

This invention relates to displays, and specifically to transparent displays with an image that is visible from one side of the display but not the other.

DESCRIPTION OF RELATED ART

Generally speaking, advertising is the paid promotion of goods, services, companies and ideas by an identified sponsor. Advertisements on the side of buildings were common in the early-20th century U.S. One modern example is the NASDAQ sign at the NASDAQ Market Site at 4 Times Square on 43rd Street. Unveiled in January 2000, it cost $37 million to build. The sign is 120 feet high and is the largest LED display in the world. NASDAQ pays over $2 million a year to lease the space for this sign. This is actually considered a good deal in advertising as the number of "impressions" the sign makes far exceeds those generated by other ad forms. However, advertisements on the side of a building cover up what otherwise would be space for windows in the building.

Thus, what is needed is an apparatus that would provide advertisements on the side of buildings while still allowing for windows in the advertisement space.

SUMMARY

In one embodiment of the invention, a display system includes a projection screen and a projector. The projection screen includes a retarder plate between a polarizer and a transparent screen. The projector projects an image through the polarizer and the retarder plate onto the transparent screen. The image is visible from a first side of the transparent screen but invisible from a second side of the transparent screen because any light passing twice through the retarder plate is blocked by the polarizer. Thus, the projection screen frees a person on the second side of the transparent screen from any distraction caused by the image while still allowing the person to look out through the projection screen.

BRIEF DESCRIPTION OF THE DRAWINGS

FIG. 3 illustrates a transparent organic light-emitting diode that emits polarized light in one embodiment of the invention.

FIG. 4 illustrates a transparent display system in one embodiment of the invention.

FIG. 5 illustrates an alternative pattern for nontransparent light-emitting pixels and transparent non-emitting pixels in the transparent display system of FIG. 4 in one embodiment of the invention.

Use of the same reference numbers in different figures indicates similar or identical elements.

DETAILED DESCRIPTION

Figure 1:
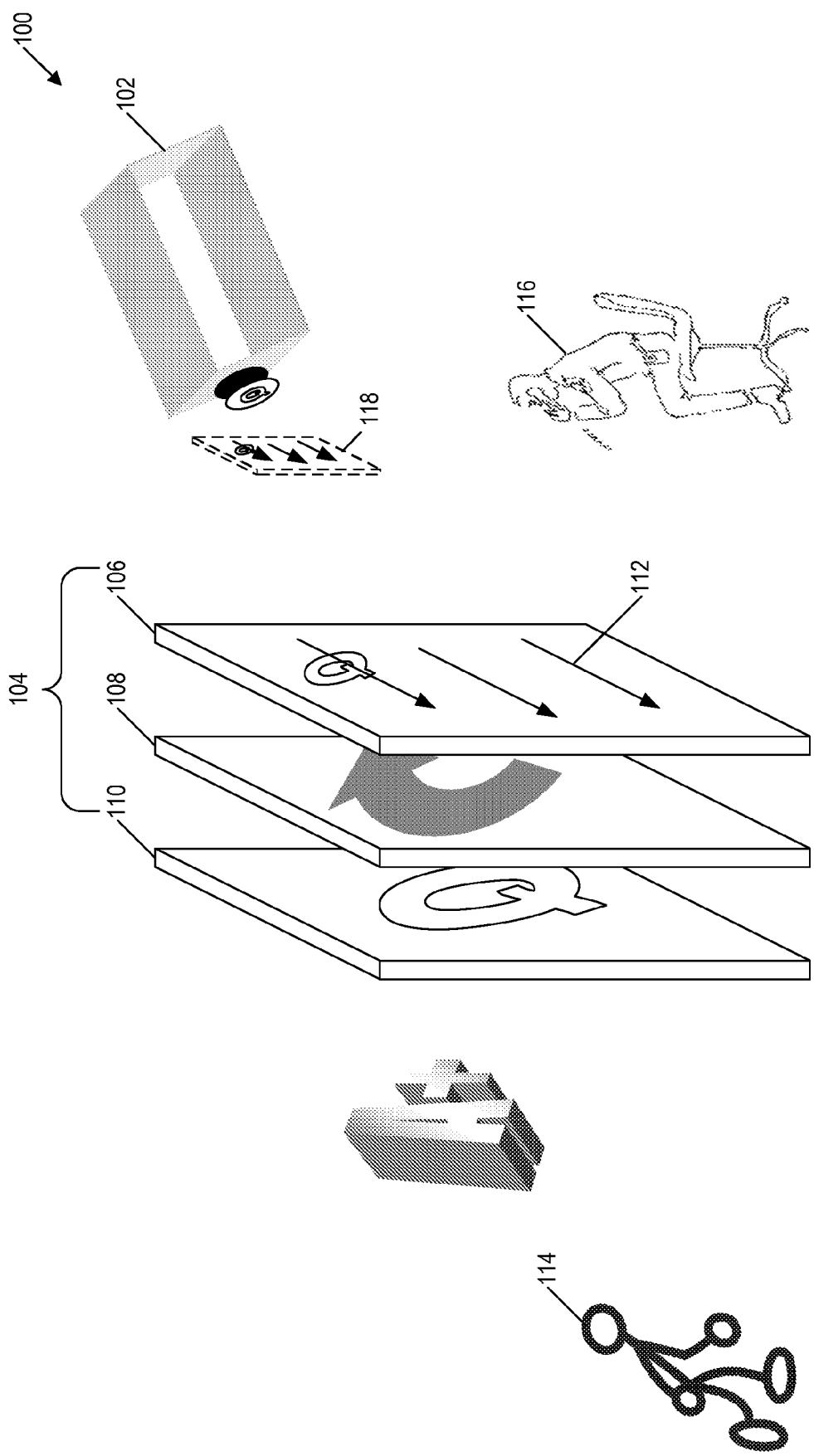
FIG. 1 illustrates a rear-projection transparent display system in one embodiment of the invention.

FIG. 1 illustrates a rear-projection transparent display system 100 in one embodiment of the invention. System 100 includes a projector 102 that generates an image "Q" toward a projection screen 104. Projector 102 can be a liquid crystal display (LCD) projector, a digital light processing (DLP) projector, a laser projector, or any other projection device. Depending on the application, image Q can be a still image, a slideshow of still images, or a video stream.

Projection screen 104 includes a polarizer 106, a retarder plate 108, and a transparent screen 110. Although shown spaced apart, polarizer 106, retarder plate 108, and transparent screen 110 may be directly mounted on each other. Image Q propagates from projector 102 through polarizer 106. After passing through polarizer 106, image Q only has polarized light. In one embodiment, polarizer 106 is a linear polarizer and image Q only has linearly polarized light aligned along a first direction 112. Polarizer 106 may polarize light by absorption, scattering, or refraction. In one embodiment, polarizer 106 is a glass panel with a linear polarizing film. Alternatively, polarizer 106 is made of a polarizing material.

Image Q then propagates through retarder plate 108 and strikes transparent screen 110. In one embodiment, retarder plate 108 is a quarter-wave plate. When image Q strikes transparent screen 110, it becomes visible on both sides of the screen. In one embodiment, transparent screen 110 is a transparent diffusion screen such as the HoloPro™ from G+B pronova GmbH of Germany, the Holo Screen from dnp Denmark of Denmark, or the TransScreen from Laser Magic of Los Angeles, Calif.

Any light that travels back from transparent screen 110 through retarder 108 becomes linearly polarized along a second direction orthogonal to the first direction and is therefore blocked by polarizer 106. Thus, image Q is visible from one side of projection screen 104 and invisible from the other side of projection screen 104.

In one embodiment, projection screen 104 is a window or a glass door on the side of a building. Thus, a person 114 outside of the building sees image Q on projection screen 104 while a person 116 inside the building does not see image Q on projection screen 104. This allows person 116 to be free from any distraction caused by image Q while still allowing person 116 to see other objects outside of the projection screen 104 that are illuminated by non-polarized light, such as object "A+."

In system 100, a small image Q may be visible on projection screen 104 to person 116. This occurs when projector 102 projects images with non-polarized light that is partly transmitted through polarizer 106 and partly reflected by polarizer 106. The small reflected image Q can be avoided by using an LCD projector 102 that produces images with light aligned along polarization direction 112. Alternatively, an additional polarizer 118 having polarization direction 112 can be placed before or on the lens of projector 102.

Although a linear polarizer and a quarter-wave plate are specifically mentioned above, polarizer 106 and retarder 108 may have different polarizing characteristics as long as polarizer 106 blocks out any return light from image Q that passes twice through retarder 108.

Figure 2:
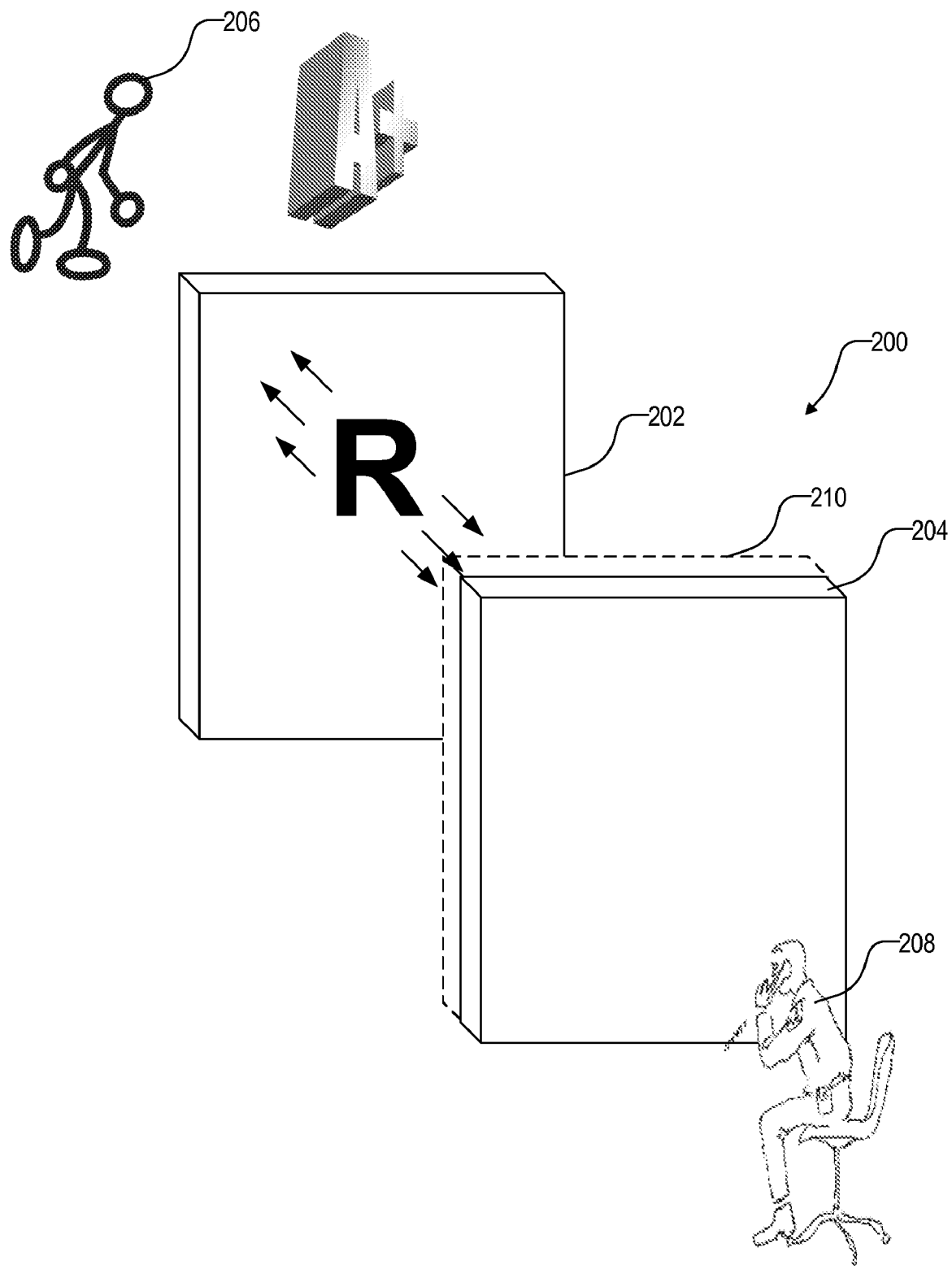
FIG. 2 illustrates a transparent display system in one embodiment of the invention.

FIG. 2 illustrates a transparent display system 200 in one embodiment of the invention. Display system 200 includes a transparent display 202 and a polarizer 204. Although shown spaced apart, transparent display 202 and polarizer 204 may be mounted directly on each other.

Transparent display 202 has a transparent screen that generates an image "R" that is visible from both sides of the display. Image R consists of polarized light that propagates away from both sides of transparent display 202. Depending on the application, image R can be a still image, a slideshow of still images, or a video stream.

In one embodiment, transparent display 202 is a transparent organic light-emitting diode (OLED) display that emits linearly polarized light. FIG. 3 illustrates that OLED display 202 consists of an organic emissive layer 302 sandwiched between a transparent cathode 304 and a transparent anode 306 on a transparent substrate 308. An example of a transparent OLED display is the TOLEDO® from Universal Display Corporation of Ewing, N.J. To emit linearly polarized light, an orientation layer 310 is formed on anode 306 and then emissive layer 302 is formed on orientation layer 310. An example of an organic OLED that emits polarized light is described in "Polarized Emission of PPV Oligomers" by Lauhof et al., 2005 Conference of German Liquid Crystal Society.

Referring back to FIG. 2, some of the linearly polarized light of image R propagates from transparent display 202 to polarizer 204, which blocks the linearly polarized light from traveling any further. Thus, image R is visible from one side of display system 200 and invisible from the other side of display system 200. Polarizer 204 may polarize light by absorption, scattering, and refraction. In one embodiment, polarizer 204 is a glass panel with a linear polarizing film. Alternatively, polarizer 204 is made of a polarizing material.

In one embodiment, display system 200 is part of a window or a glass door on the side of a building. Thus, a person 206 outside of the building sees image R on display system 200 while a person 208 inside the building does not see image R on display system 200. This allows person 208 to be free from any distraction caused by image R while still allowing person 208 to see other objects outside of display system 200 that are illuminated by non-polarized light, such as object "A+."

In one embodiment, a one-way vision film 210 is inserted between transparent display 202 and polarizer 204. One-way vision film 210 allows person 208 to look out through display system 200 but does not allow person 206 to look through display system 200 and into the building. In one embodiment, one-way vision film 210 is a perforated film having a light color (e.g., white) on the side facing transparent display 202 and a dark color (e.g., black) on the side facing polarizer 204.

FIG. 4 illustrates a transparent display system 400 in one embodiment of the invention. System 400 includes a screen 402 with an alternating pattern of nontransparent light-emitting pixels 404 and transparent non-emitting pixels 406. Thus, screen 402 appears at least semi-transparent as light can pass through transparent non-emitting pixels 406.

The pattern of nontransparent light-emitting pixels 404 and transparent non-emitting pixels 406 can be varied as long as they are evenly distributed so screen 402 appears semi-transparent. In one embodiment, the pattern consists of alternating lines of nontransparent light-emitting pixels 404 and transparent non-emitting pixels 406. Alternatively, as illustrated in FIG. 5, the pattern consists of nontransparent light-emitting pixels 404 interspersed with transparent non-emitting pixels 406.

In one embodiment, nontransparent light-emitting pixels 404 are OLED pixels with transparent cathodes and anodes, and opaque substrates. Transparent cathodes and anodes are necessary so these conductive lines can run across the transparent non-emitting pixels without obscuring their transparency. Opaque substrates are necessary so that the OLED pixels only transmit light on one side of screen 402. In one embodiment, transparent non-emitting pixels 406 are simply dummy OLED pixels with transparent substrate and devoid of an emissive layer.

Various other adaptations and combinations of features of the embodiments disclosed are within the scope of the invention. Numerous embodiments are encompassed by the following claims.

What is claimed is:

1. A display system, comprising a pattern of nontransparent light-emitting pixels and transparent non-emitting pixels, wherein the nontransparent light-emitting pixels comprise organic light-emitting diodes with opaque substrates and transparent cathodes and anodes.

2. The system of claim 1, wherein the transparent non-emitting pixels comprise dummy organic light-emitting diodes with transparent substrates and devoid of an emissive layer.

3. The system of claim 1, wherein the pattern comprises alternating lines of light-emitting pixels and transparent non-emitting pixels.

4. The system of claim 1, wherein the pattern comprises light-emitting pixels interspersed with transparent non-emitting pixels.

5. A display system, comprising a pattern of nontransparent light-emitting pixels and transparent non-emitting pixels, wherein the transparent non-emitting pixels comprise dummy organic light-emitting diodes with transparent substrates and devoid of an emissive layer.

6. The system of claim 5, wherein the nontransparent light-emitting pixels comprise organic light-emitting diodes with opaque substrates and transparent cathodes and anodes.

7. The system of claim 5, wherein the pattern comprises alternating lines of light-emitting pixels and transparent non-emitting pixels.

8. The system of claim 5, wherein the pattern comprises light-emitting pixels interspersed with transparent non-emitting pixels.

* * * * *